United States Patent
Kison et al.

(10) Patent No.: US 6,630,817 B1
(45) Date of Patent: Oct. 7, 2003

(54) ELECTRICAL CIRCUIT ARRANGEMENT FOR CONVERTING AN INPUT VOLTAGE

(75) Inventors: Thomas Kison, Lohr am Main (DE); Alexander Meisselbach, Rieneck (DE)

(73) Assignee: Bosch Rexroth AG, Lohr/Main (DE)

( * ) Notice: Subject to any disclaimer, the term of this patent is extended or adjusted under 35 U.S.C. 154(b) by 0 days.

(21) Appl. No.: 10/110,369

(22) PCT Filed: Oct. 20, 2000

(86) PCT No.: PCT/EP00/10326
§ 371 (c)(1),
(2), (4) Date: Aug. 19, 2002

(87) PCT Pub. No.: WO01/31663
PCT Pub. Date: May 30, 2001

(30) Foreign Application Priority Data

Oct. 28, 1999 (DE) ................................. 199 51 944

(51) Int. Cl.⁷ ................................................ G05F 1/40
(52) U.S. Cl. ........................................ 323/274; 323/280
(58) Field of Search ................................. 323/268, 273, 323/274, 275, 280, 281

(56) References Cited

U.S. PATENT DOCUMENTS

| | | | |
|---|---|---|---|
| 5,191,278 A | | 3/1993 | Carpenter |
| 5,939,867 A | * | 8/1999 | Capici et al. ............... 323/280 |
| 6,198,266 B1 | * | 3/2001 | Mercer ....................... 323/275 |

FOREIGN PATENT DOCUMENTS

| | | |
|---|---|---|
| DE | 2617444 | 10/1976 |
| DE | 19545531 | 6/1996 |
| DE | 19547155 | 2/1997 |
| DE | 19808297 | 9/1998 |
| DE | 19837374 | 4/1999 |
| EP | 0511856 | 11/1992 |
| EP | 0779702 | 6/1997 |

* cited by examiner

*Primary Examiner*—Jessica Han
(74) *Attorney, Agent, or Firm*—Martin A. Farber

(57) ABSTRACT

An electrical circuit arrangement for converting an input voltage into an impressed electrical output variable, to convert the input voltage optionally into an output voltage or into an output current, wherein the input voltage is fed to the desired value input of a regulator. A negative feedback voltage is fed to the actual value input of the regulator, the voltage being a measure of the respectively effective output variable. For converting the input voltage into an impressed output voltage, the negative feedback voltage is a voltage proportional to the output voltage. For converting the input voltage into an impressed current, the negative feedback voltage is a voltage dropped across a resistor through which the output current flows. Circuit arrangements of this type serve for further processing of a unipolar voltage in circuit arrangements which require a current as input variable, or a voltage whose range deviates from that of the input voltage. This is the case e.g. when the digital output signal of a microprocessor is converted into an analog signal by pulse width modulation and averaging of the pulse-width-modulated signal.

13 Claims, 2 Drawing Sheets

ELECTRICAL CIRCUIT ARRANGEMENT FOR CONVERTING AN INPUT VOLTAGE

FIELD AND BACKGROUND OF THE INVENTION

The invention relates to an electrical circuit arrangement for converting an input voltage into an impressed electrical output variable, there being a predetermined assignment between input voltage and output variable.

A circuit arrangement of this type is disclosed in DE 195 47 155 C1. It is provided in particular as a desired value transmitter for driving continuous hydraulic valves with integrated drive electronics. The known circuit arrangement converts an electrical input voltage into an impressed electrical output variable. There is a linear relationship between the input voltage and the output variable. If the load resistance connected to the circuit arrangement is smaller than a predetermined value of e.g. 500 Ω, the input voltage is converted into an output current. By contrast, if the load resistance is greater than the predetermined value, the input voltage is converted into an output voltage. The fact of whether the electrical output variable is a voltage or a current depends on the magnitude of the load resistance. With this circuit arrangement, it is not possible to convert the input voltage into an output current or into an output voltage independently of the magnitude of the load resistance.

SUMMARY OF THE INVENTION

The invention is based on the object of providing an electrical circuit arrangement of the type mentioned in the introduction which converts an input voltage, fed to the circuit arrangement, optionally into an output current or into an output voltage independently of the magnitude of the load resistance.

According to the invention the input voltage ($u_e$) is fed to a desired value input (5) of a regulator (4), a negative feedback voltage ($u_g$) is fed to an actual value input (6) of the regulator (4), said negative feedback voltage being a measure of the respectively effective output variable ($u_a$, $i_a$) of the circuit arrangement, for converting the input voltage ($u_e$) into an output voltage ($u_a$), the negative feedback voltage ($u_{gu}$) is a voltage ($k1 \times u_a$) proportional to the output voltage ($u_a$), and for converting the input voltage ($u_e$) into an output current ($i_a$), the negative feedback voltage ($u_{gi}$) is a voltage ($k2 \times \Delta_u$) which is proportional to a voltage ($\Delta_u = i_a \times R8$) dropped across a first resistor (8) through which the output current ($i_a$) flows. The invention makes it possible to convert an input voltage optionally into an output voltage or into an output current in a manner dependent on a control signal fed to the circuit arrangement. When the input voltage is converted into an output voltage, it is possible to realize different values of the gain factor between input voltage and output voltage. Equally, when the input voltage is converted into an output current, it is possible to realize different values of the gain factor between input voltage and output current.

Through additive superposition of a constant voltage to the voltage which is a measure of the output voltage of the circuit arrangement, the output voltage range can be shifted relative to the input voltage range. In particular, a unipolar input voltage whose range extends e.g. from 0 V to −5 V can be converted into a bipolar output voltage whose range lies e.g. between −10 V and +10 V. Computing circuits are preferably provided for forming the negative feedback voltages. The use of electronic analog switches formed as changeover switches allows driving of the changeover switches with low-power electrical control signals. Electronic switches require little space. They have a low susceptibility to interference since they contain no mechanical contacts which can wear over the course of time or exhibit contact resistances. In contrast to electromagnetic relays, the power loss which occurs when the coil of a relay is energized and the associated evolution of heat are obviated in the case of electronic switches. A constant voltage which is additionally fed to the second computing circuit ensures that even when the input voltage is converted into an output voltage, positive voltage values are present at the inputs of the electronic switch. Advantageous configurations of the regulator and of the computing circuits are specified. A power amplifier arranged between the output of the regulator and the resistor through which the output current flows makes it possible to manage with a lower supply voltage than if an operational amplifier with a correspondingly large output current is used in the regulator.

BRIEF DESCRIPTION OF THE DRAWINGS

The invention is explained with more of its details below using an exemplary embodiment illustrated in the drawings, in which.

DETAILED DESCRIPTION OF THE PREFERRED EMBODIMENT

Figure 1:
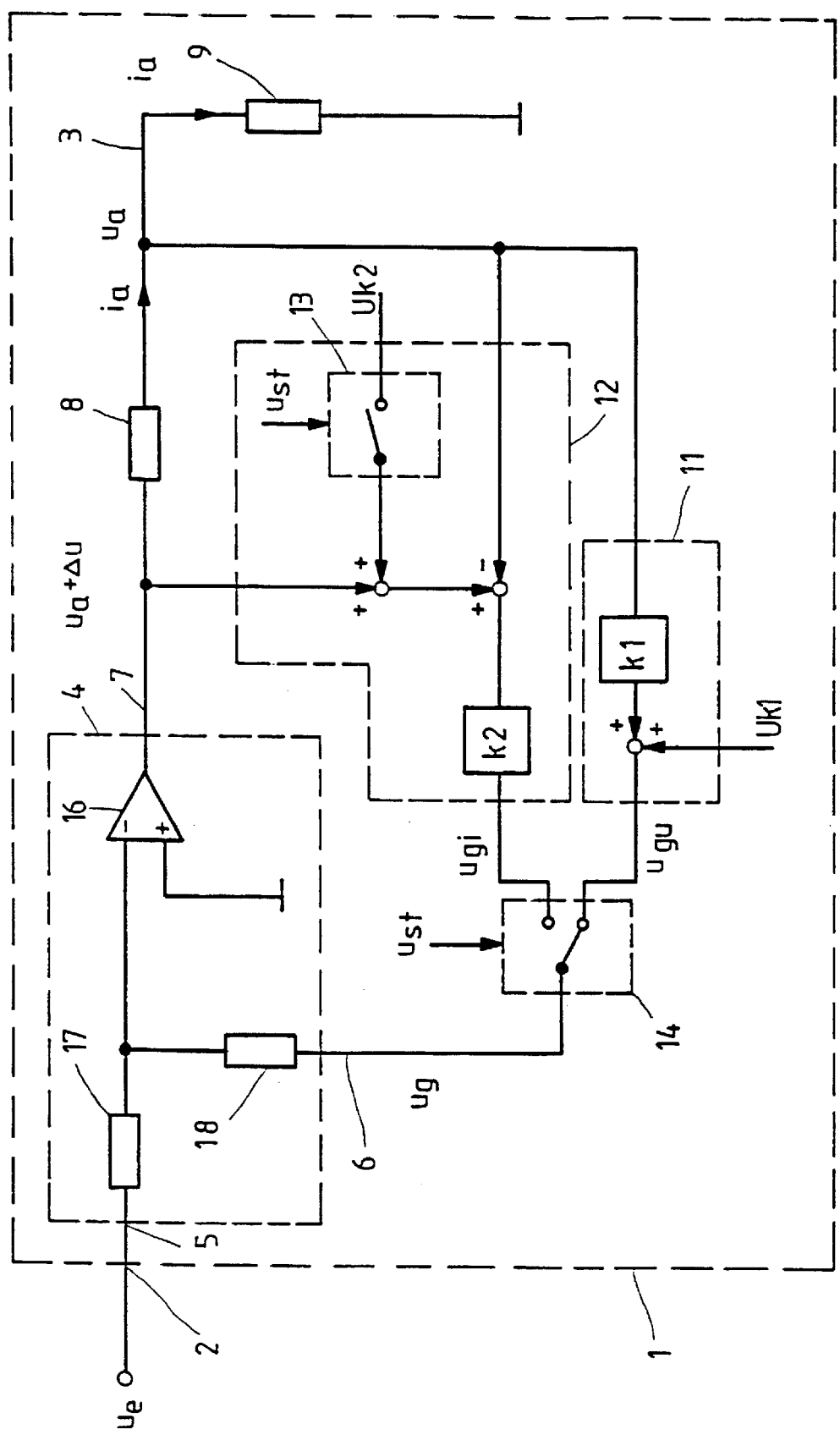
FIG. 1 shows a basic circuit diagram of a circuit arrangement according to the invention.

FIG. 1 shows an electrical circuit arrangement 1, which converts an electrical input voltage $u_e$ optionally into an impressed output voltage $u_a$ or into an impressed electrical output current $i_a$ in a manner dependent on a low-power control signal designated by $u_{st}$. A circuit arrangement of this type is required in particular when the output voltage of a digital/analog converter which converts the digital output signal of a microprocessor into a unipolar voltage is processed further in circuit arrangements which require a current as input variable or a voltage whose range deviates from the range of the output variable of the digital/analog converter.

Input and output of the circuit arrangement 1 are provided with the reference symbols 2 and 3, respectively. The circuit arrangement 1 contains a regulator 4 having a desired value input 5 and an actual value input 6 and also an output 7. The output voltage $u_e$ is fed to the desired value input 5 of the regulator 4. A negative feedback voltage $u_g$, which is a measure of the respectively effective electrical output variable $i_a$ or $u_a$, is fed to the actual value input 6 of the regulator 4. A resistor 8 connects the output 7 of the regulator 4 to the output 3 of the circuit arrangement 1. A further resistor 9 is connected to the output 3. The resistor 9, is, in practice, the input resistor of a downstream circuit which loads the output 3 of the circuit arrangement 1. The output current $i_a$ flows, via the series-connected resistors 8 and 9. The voltage dropped across the resistor 8 is designated by $\Delta u$; it turns out to be $\Delta u = i_a \times R8$. In this case, R8 designates the nonreactive resistance of the resistor 8.

A first computing circuit 11 forms a voltage $u_{gu}$ from the output voltage $u_a$, a first adjustable factor k1 and a constant voltage $U_{k1}$. The voltage $u_{gu}$ turns out to be $u_{gu} = (k1 > u_a) + U_{k1}$. A second computing circuit 12 forms a voltage $u_{gi}$ from the voltage drop $\Delta u$ across the resistor 8 and a second adjustable factor k2. For this purpose, the voltage $U_a + \Delta_u$ at one terminal of the resistor 8 and the voltage $u_a$ at the other terminal of the resistor 8 are fed to the computing circuit 12. In addition, a constant voltage $U_{k2}$ is fed to the computing circuit 12. The voltage $U_{k2}$ can be connected via a switch 13 in a manner dependent on the control signal $u_{st}$. Depending on the position of the switch 13, the voltage $u_{gi}$ turns out to be $u_{gi}=k2\times(\Delta+U_{k2})$ or $U_{gi}=k2\times\Delta u$. A changeover switch 14 is arranged between the outputs of the computing circuits 11 and 12. The changeover switch 1-4 connects the output of one of the two computing circuits 11 or 12 to the actual value input 6 of the regulator 4 in a manner dependent on the control signal $u_{st}$.

In order to convert the input voltage $u_e$ into an output voltage $U_a$, the changeover switch 14 is driven in such a way that it connects the actual value input 6 of the regulator 4 to the output of the computing circuit 11. In this operating state, the output voltage $u_{gu}$ of the computing circuit 11 serves as negative feedback voltage $u_g$ of the regulator 4. The switch 13 is closed in this operating state. The regulator 4, together with the computing circuit 11, forms a control loop for the output voltage $u_a$. The reference variable of said control loop is the input voltage $u_e$. The constant voltage $U_{k1}$ allows the conversion of a unidirectional input voltage (e.g. in the range from 0 V to −5 V) into a bidirectional output voltage (e.g. in the range from −10 V to +10 V). In this case, in accordance with the nonreactive resistance of the load resistor 9 which is designated by R9 below, the output current $i_a$ of the circuit arrangement 1 is established according to the relationship $i_a=u_a/R9$.

In order to convert the input voltage $u_e$ into an output current $i_a$, the changeover switch 14 is driven in such a way that it connects the actual value input 6 of the regulator 4 to the output of the computing circuit 12. In this operating state, the output voltage $u_{gi}$ of the computing circuit 12 serves as negative feedback voltage $u_g$ of the regulator 4. The switch 13 is open in this operating state. The regulator 4, together with the computing circuit 12, forms a control loop for the output current $i_a$. The reference variable of said control loop is the input voltage $u_e$. In this operating state, it is possible to convert a unidirectional input voltage (e.g. in the range from 0 V to −5 V) into a unidirectional output current (e.g. in the range from 0 mA to +20 mA). In this case, in accordance with the nonreactive resistance R9 of the load resistor 9, the output voltage $u_a$ of the circuit arrangement 1 is established according to the relationship $u_a=i_a\times R9$.

The regulator 4 has an operational amplifier 16. In the simplest form of the regulator 4, the input voltage $u_e$ is fed to the inverting input of the operational amplifier 16 via a resistor 17 and the negative feedback voltage $u_g$ is fed to said inverting input via a further resistor 18 and the noninverting input of the operational amplifier 16 is connected to reference-ground potential.

Figure 2:
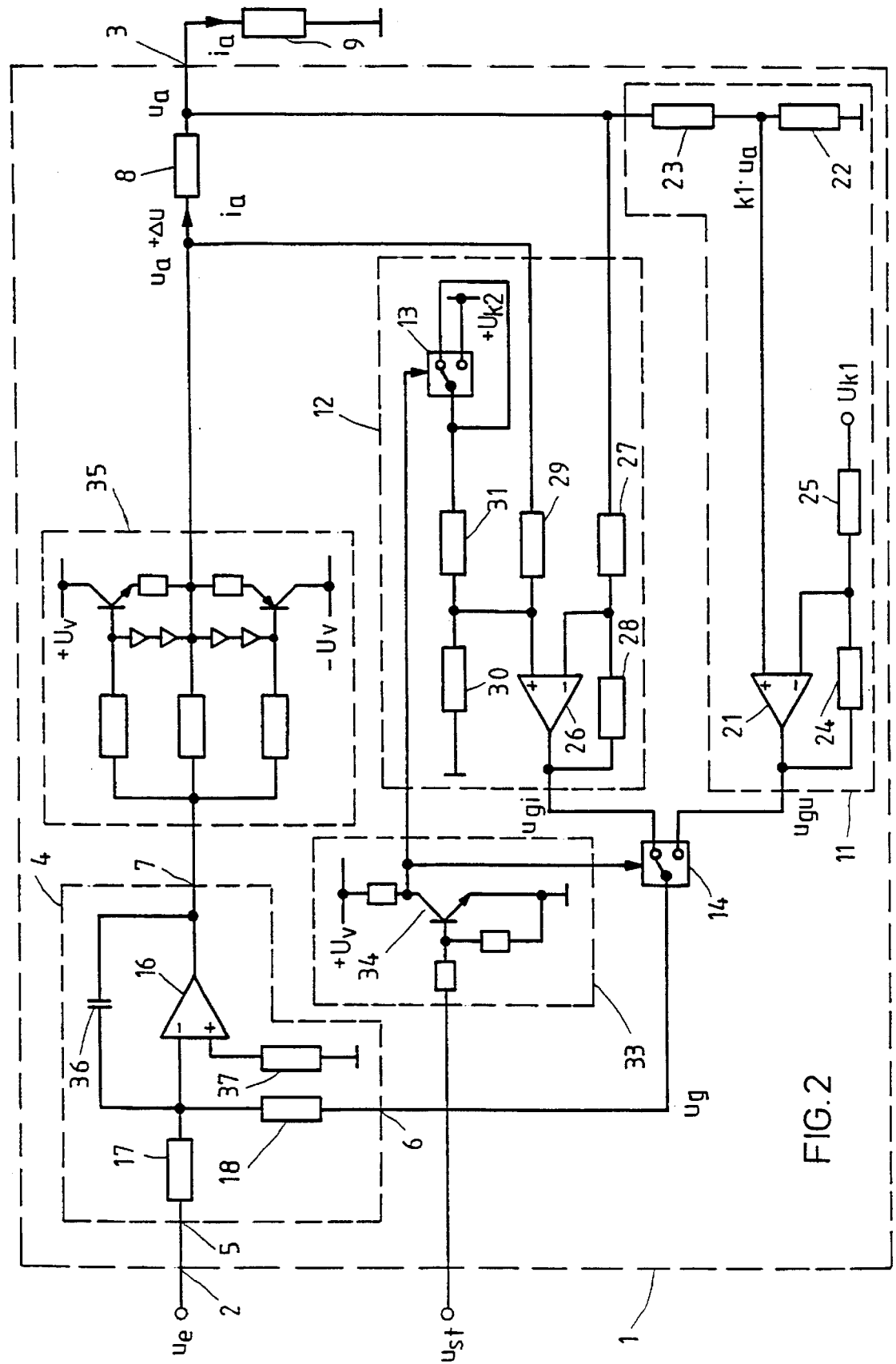
FIG. 2 shows a more detailed circuit diagram of the circuit arrangement illustrated in FIG. 1.

FIG. 2 shows a detailed illustration of the circuit arrangement according to the invention as illustrated in FIG. 1. Components and assemblies that have already been described with reference to FIG. 1 are provided with the same reference symbols in FIG. 2.

The computing circuit 11 has an operational amplifier 21. A voltage divider formed from two resistors 22 and 23 is arranged between the output 3 of the circuit arrangement 1 and reference-ground potential. The partial voltage $k1\times u_a$—dropped across the resistor 22—of the output voltage $u_a$ is fed to the noninverting input of the operational amplifier 21. The resulting resistance of the series circuit of resistors 22 and 23 is chosen to be very much greater than the resistor 9, so that the current flowing via the resistors 22 and 23 is negligibly small compared with the current $i_a$ flowing via the resistor 9. The output of the operational amplifier 21 is connected to its inverting input via a resistor 24. In addition, the constant voltage $U_{k1}$ is fed to the inverting input of the operational amplifier 21 via a resistor 25.

The computing circuit 12 has an operational amplifier 26. The output voltage $u_a$ is fed to the inverting input of the operational amplifier 26 via a resistor 27. The output of the operational amplifier 26 is connected to its inverting input via a resistor 28. The voltage $u_a+\Delta u$ is fed to the noninverting input of the operational amplifier 26 via a resistor 29. The noninverting input of the operational amplifier 26 is additionally connected to reference-ground potential via a resistor 30. The switch 13—like the switch 14—is formed as a changeover switch. The constant voltage $U_{k2}$ is fed to one input of the switch 13. The other input of the switch 13 is connected to the output of the switch 13. The output of the switch 13 is connected to the noninverting input of the operational amplifier 26 via a resistor 31.

The control signal $u_{st}$ is fed to a switching amplifier 33 with a switching transistor 34. The switching amplifier 33 is connected to a positive supply voltage $+U_v$. When the control signal $u_{st}$ is positive, the switching transistor 34 turns on, and a voltage lying slightly above the reference-ground potential is fed to the control inputs of the switches 13 and 14. The switches 13 and 14 are in the position illustrated in FIG. 2, i.e. the actual value input 6 of the regulator 4 is connected to the output of the computing circuit 12 and the output of the switch 13 is directly connected to one of its inputs. In this operating state, the input voltage $u_e$ is converted into an impressed current. If the control signal $u_{st}$ is at reference-ground potential, the switching transistor 34 is turned off and the supply voltage $+U_v$ is fed to the control inputs of the switches 12 and 13. The actual value input 6 of the regulator 4 is connected to the output of the computing circuit 11 and the constant voltage $U_{k2}$ is applied to the resistor 31. In this operating state, the input voltage $u_e$ is converted into an impressed voltage.

A power stage 35 is arranged between the output 7 of the regulator 4 and the resistor 8, said power stage being supplied by the positive supply voltage $+U_v$ and a negative supply voltage $-U_v$. The power stage 35 makes it possible to use an operational amplifier 16 having only a low output current for the regulator 4. Moreover, lower supply voltages suffice when using the power stage 35 than would be necessary when using an operational amplifier having a corresponding output current in the regulator. Even though current only flows from the power stage 35 to the output 3 of the circuit. arrangement 1 when the input voltage $u_e$ is converted into the output current $i_a$, the power stage 35 is constructed symmetrically since, when the input voltage $u_e$ is converted into a bidirectional output voltage $u_a$, in the case of a negative polarity of the output voltage $u_a$, current also flows from the output 3 of the circuit arrangement 1 to the power amplifier 35.

A capacitor 36 is arranged between the output of the operational amplifier 16 and its inverting input. The capacitor 36 imparts I behavior to the regulator 4. A resistor, 37 is arranged between the noninverting input of the operational amplifier 16 and the reference-ground potential. Its nonreactive resistance corresponds to the parallel circuit formed by the resistors 17 and 18. The resistor 37 serves for offset correction of the operational amplifier 16.

The switches 11 and 14 are electronic analog switches driven by a low-power digital control signal. In the component sold by the company National Semiconductor under the designation CD4053BM/CD4053BC, three changeover switches of this type are combined in a common housing. A component of this type requires little space on the circuit board. Moreover, the evolution of heat in a component of this type is practically negligible. On the other hand, however, it should be noted that only positive voltages are permitted to be applied to the inputs of these electronic changeover switches. The following are fed to the changeover switches 13 and 14: in each case a digital voltage, which serves as control signal, and two analog voltages, in each case one of which is forwarded to the output of the changeover switch. As described above, the switching amplifier 33 applies a positive voltage to the control inputs of the switches 13 and 14, which voltage is practically equal to the positive supply voltage $+U_v$ in one operating state and is slightly greater than the reference-ground potential in the other operating state. This ensures that a positive voltage is fed to the control input of the changeover switches 13 and 14 in both operating states.

The measures described below ensure that the analog voltages fed to the signal inputs of the changeover switches 13 and 14 are also positive in both operating states. If the input voltage $u_e$ is converted into an impressed unipolar current in one operating state, the polarity of the output voltage $u_a$ is positive since output current $i_a$ flows from the output 3 of the circuit arrangement 1 via the resistor 9 to the reference-ground potential. If the input voltage $u_e$ is converted into an impressed bipolar output voltage in the other operating state, the output voltage $u_a$ is positive in a first range and negative in a second range. Therefore, the constant voltage $U_{k1}$ is to be chosen such that a positive value always results for the voltage $u_{gu}$ taking account of the value of the resistors 22, 23, 24 and 25. The resistors 24 and 25 form a voltage divider, to whose ends the voltage $u_{gu}$ and the voltage $U_{k1}$ are applied and whose tap is connected to the inverting input of the operational amplifier 21. The voltage $u_{gu}$ is therefore established in such a way that the voltage at the junction point between the resistors 24 and 25 is equal to the voltage at the junction point between the resistors 22 and 23, i.e. $k1 \times u_a$. If, by way of example, the resistor 25 is chosen to have a value twice that of the voltage $u_{gu}$ turns out to be $u_{gu}=0.25 \times u_a -0.5 \times U_{k1}$. In order that the voltage $U_{gu}$ is positive for an output voltage range from e.g. $-10$ V to $+10$ V, the constant voltage $U_{k1}$ is to be chosen to be $U_{k1}=-5$ V. This results in values of 0 V to $+5$ V for the voltage $u_{gu}$ and a range from 0 V to $-5$ V for the input voltage $u_e$. For all values of the output voltage $u_a$ which are greater than $-10$ V, the voltage $u_{gu}$ fed to the changeover switch 14 is thus positive—as required.

As described below, the voltage $u_{gi}$ is also positive in both operating states. When the input voltage $u_a$ is converted into an impressed current, the changeover switch 13 is in the position illustrated in FIG. 2, i.e. the output of the changeover switch 13 is connected to one input and the voltage $U_{k2}$ is applied to the other input. The voltage $U_{k2}$ is a positive voltage, e.g. the positive supply voltage $+U_v$. The impressed current $i_a$ flows from the output of the power amplifier 35 via the resistors 8 and 9 to the reference-ground potential. The resistors 30 and 29 form a voltage divider to which the voltage $u_a+\Delta u$ is fed and whose tap is connected to the noninverting input of the operational amplifier 26. If, by way of example, the resistor 30 is chosen to have a value 10 times that of the resistor 29, then the voltage fed to the noninverting input of the operational amplifier 26 is $10/11 \times (u_a+\Delta u)$. Since—as explained above—the voltage $u_a$ only assumes positive values in this operating state and since no current flows via the resistor 31, a positive voltage is present—as required—at the input connected to the output of the changeover switch 13. The resistors 27 and 28 form a voltage divider to whose ends the voltages $u_{gi}$ and $u_a$ are applied and whose tap is connected to the inverting input of the operational amplifier 26. The voltage $u_{gi}$ is established in such a way that the voltage at the inverting input of the operational amplifier 26 is equal to the voltage fed to the noninverting input, i.e. $10/11 \times (u_a - \Delta u)$. If the resistor 28 is chosen to have a value ten times that of the resistor 27, the voltage $u_{gi}$ turns out to be $u_{gi}=10 \times \Delta u$. In this case, the voltage $u_{gi}$ is independent of the magnitude of the output voltage $u_a$. Since the voltage $\Delta u$ is positive when the input voltage $u_e$ is converted into an impressed current, the voltage $u_{gi}$ fed to the changeover switch 14 in this operating state is likewise positive. If the output current is intended to have a value of between 0 mA and 20 mA given an input voltage $u_e$ of 0 V to $-5$ V, a voltage $\Delta u$ of 0 V to 0.5 V must be dropped across the resistor 8. This results in a resistance of $R8=25\ \Omega$ for the resistor 8.

When the input voltage $u_e$ is converted into an impressed voltage, the changeover switch, 14 connects the output of the operational amplifier 21 to the actual value input 6 of the regulator 4. The control loop is closed via the computing circuit 11, and the computing circuit 12 is open on the output side. The changeover switch 13 then connects the resistor 31 to the voltage $U_{k2}$. The voltage $U_{k2}$ is fed back from the output of the changeover switch 13 to the other input of the changeover switch 13. As a result, a positive voltage is applied—as required—to both signal inputs of the changeover switch 13. If the resistor 31 is chosen to have the same value as the resistor 29, the resistors 29 and 31 can be considered as a voltage divider to whose ends the voltage $U_{k2}$ and the voltage $u_a+\Delta u$ are fed. There is then present at the tap of this voltage divider a voltage which is smaller than the larger of the voltages fed to it by half the difference between said voltages. The voltage $U_{k2}$ is chosen in such a way that, even in the worst-case scenario, i.e. in the case of negative values of the output voltage $u_a$, a positive voltage is fed to the noninverting input of the operational amplifier 26. Since the resistor 30 is ten times larger than the resistors 29 and 31, its influence on the voltage fed to the noninverting input of the operational amplifier 26 is negligible in the case of the qualitative consideration that is carried out here. Since—as explained above—the resistor 28 is ten times larger than the resistor 27, there is fed to the inverting input of the operational amplifier 26 a voltage which is smaller than the voltage $u_{gi}$ by 10/11 of the difference between the voltage $u_{gi}$ and the voltage $u_a$. Since this voltage is smaller than the voltage fed to the noninverting input, owing to the output voltage of the operational amplifier 26 which is limited to the positive supply voltage $+U_v$, the output voltage of the operational amplifier 26 and thus the voltage $u_{gi}$ is practically equal to the positive supply voltage $+U_v$. Consequently, the voltage $u_{gi}$ is positive—as required. Since the voltage $u_{gi}$ is not forwarded to the regulator 4 in this operating state, its magnitude is unimportant. In a generally customary manner, the changeover switches 13 and 14 are selected such that the maximum permissible voltages are greater than the voltages that occur in the circuit arrangement 1.

We claim:

1. An electrical circuit for converting an input voltage into an impressed electrical output variable, there being a predetermined relationship between input voltage and output variable, wherein the circuit comprises a regulator with a first resistor connected to an output of the regulator, the regulator further comprises a desired value input and an actual value input, and the output serves for outputting the output variable, and wherein the input voltage ($u_e$) is fed to the desired value input (5) of the regulator (4), a negative feedback voltage ($u_g$) proportional to the output variable is fed to the actual value input (6) of the regulator (4), said negative feedback voltage being a measure of either of an output voltage or an output current of the output variable ($u_a$, $i_a$) of the circuit arrangement, during operation of the regulator for converting the input voltage ($u_e$) into the output voltage ($u_a$), the negative feedback voltage is proportional to the output voltage, and during operation of the regulator for converting the input voltage ($u_e$) into an output current ($i_a$), the negative feedback voltage is proportional to the output current and is obtained from a voltage dropped across the first resistor (8) through which the output current ($i_a$) flows.

2. The circuit as claimed in claim 1, further comprising a summing circuit connecting to the regulator output, and wherein for converting the input voltage ($u_e$) into the output voltage ($u_a$), the summing circuit provides negative feedback voltage by summing a voltage proportional to the output voltage ($u_a$) plus a first constant voltage ($U_{k1}$).

3. The circuit as claimed in claim 2, further comprising a first computing circuit and a second computing circuits and a controllable switch, wherein the output of the regulator is connected via the first resistor to a load, the output voltage ($u_a$) and the first constant voltage ($U_{k1}$) are fed to the first computing circuit. (11), a voltage ($u_a+\Delta u$) at one terminal of the first resistor (8) and a voltage ($u_a$) at an other terminal of the first resistor (8) are fed to the second computing circuit (12), and the controllable switch (14) is connected between outputs of the first and the second computing circuits (11, 12) and the actual value input (6) of the regulator (4), said switch connecting the output of one of the two computing circuits (11, 12) to the actual value input of the regulator (4).

4. The circuit as claimed in claim 3, wherein the switch (14) is an electronic analog switch which is formed as a changeover switch and is controllable by a control signal ($u_{st}$).

5. The circuit as claimed in claim 4, wherein during a conversion of the input voltage ($u_e$) into an output voltage ($u_a$), the second computing circuit combines a second constant voltage with the voltages received from the two terminals of the first resistor for enlarging a, voltage ($u_{gi}$) fed by the second computing circuit to the switch (14).

6. The circuit as claimed in claim 3, wherein the first computing circuit (11) comprises a second operational amplifier (21), a voltage divider connected via the first resistor (8) to the output of the regulator, a fourth resistor (25) for applying the constant voltage to an inverting input of the second operational amplifier, and a second feedback resistor,connecting between the inverting input of the second operational amplifier and an output of the second operational amplifier, and a partial voltage ($k1 \times u_a$) tapped off at the voltage divider (22, 23) is fed to a noninverting input of the second operational amplifier (21).

7. The circuit as claimed in claim 3, wherein the second computing circuit (12) comprises a third operational amplifier (26), a fifth resistor (27) connected via the first resistor (8) to the output of the regulator for feeding an output voltage of the regulator to an inverting input of the third-operational amplifier (26), a third feedback resistor (28) connected between the inverting input of the third operational amplifier and an output of the third operational amplifier, a sixth resistor (29) connected to the output of the regulator, and a further summing-circuit for summing a second constant voltage ($U_{k2}$) with a regulator output voltage provided by the sixth resistor, an output signal of the further summing circuit is fed to a noninverting input of the third operational amplifier (26), and the noninverting input of the third operational amplifier (26) is connected to reference-ground potential (1) via a seventh resistor (30), the sixth and the seventh resistors being a part of the further summing circuit.

8. The circuit as claimed in claim 7, wherein the second computing circuit (12) further comprises a second switch (13), and an eight resistor (31) connected to the further summing circuit of the second computing circuit, and said second constant voltage ($U_{k2}$) is fed to the noninverting input of the third operational amplifier (26) by the second switch (13) and an eighth resistor (31) via the further summing circuit.

9. The circuit as claimed in claim 8, wherein the second switch (13) is an electronic changeover switch which is controllable by control signal ($u_{st}$), an output of the second switch (13) is connected to one of its inputs, and the second constant voltage ($U_{k2}$) is fed to another of the inputs of the second switch (13).

10. The circuit as claimed in claim 1, wherein the regulator (4), further comprises first operational amplifier (16), a second resistor (17), and a third resistor (18) which serves as a first feedback resistor for the regulator, wherein the desired value input of the regulator is connected via the second resistor to an inverting input of the operational amplifier, the actual value input of the regulator is connected via the third resistor to the inverting input of the operational amplifier, and a noninverting input of the operational amplifier is connected to reference-ground potential. (1).

11. The circuit as claimed in claim 1, further comprising a power stage (35) arranged between the output (7) of the regulator (4) and the first resistor (8).

12. The circuit as claimed in claim 10, further comprising a capacitor (36) arranged between an output of the first operational amplifier (16) and the inverting input of the first operational amplifier.

13. The circuit as claimed in claim 10, wherein a ninth resistor (37) is arranged between the noninverting input of the first operational amplifier (16) and the reference-ground potential (1), a value of the second resistor corresponding to a parallel circuit formed by the second resistor (17) and the third resistor (18).

* * * * *